United States Patent
Mizuochi et al.

(10) Patent No.: US 6,659,441 B2
(45) Date of Patent: Dec. 9, 2003

(54) TRAVELLING WORKTABLE APPARATUS

(75) Inventors: Masaki Mizuochi, Hitachinaka (JP); Yoshimasa Fukushima, Hitachinaka (JP); Masami Katsuyama, Hitachinaka (JP); Toshinori Kobayashi, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/206,343

(22) Filed: Jul. 29, 2002

(65) Prior Publication Data

US 2003/0020225 A1 Jan. 30, 2003

Related U.S. Application Data

(62) Division of application No. 09/793,941, filed on Feb. 27, 2001, now Pat. No. 6,446,950.

(30) Foreign Application Priority Data

Mar. 23, 2000 (JP) .......................................... 2000-87111

(51) Int. Cl.$^7$ ................................................. G02B 7/18
(52) U.S. Cl. ........................................................ 269/73
(58) Field of Search ............................ 269/73, 71, 285, 269/307; 403/381, 382, 13, 14; 359/873, 872; 108/143

(56) References Cited

U.S. PATENT DOCUMENTS

| | | | | | |
|---|---|---|---|---|---|
| 4,953,965 A | * | 9/1990 | Iwase et al. | ................ | 359/872 |
| 5,066,131 A | * | 11/1991 | Iwata et al. | ................ | 356/401 |
| 6,359,677 B2 | * | 3/2002 | Itoh et al. | .................... | 355/53 |
| 6,404,505 B2 | * | 6/2002 | Matsui | ....................... | 356/620 |

FOREIGN PATENT DOCUMENTS

JP  1-274936  11/1989

* cited by examiner

*Primary Examiner*—Robert C. Watson
(74) *Attorney, Agent, or Firm*—Kenyon & Kenyon

(57) ABSTRACT

In a travelling worktable apparatus including a roller guide unit to guide a travelling table. Deformation of a sample table caused in association with precision of the guide unit such as deviation in precision of rail attachment and precision of rollers is prevented while keeping rigidity of the roller guide. This keeps a fixed distance between a bar mirror unit and a sample on the sample table. For this purpose, the Y table (top table) of the prior art is subdivided into a travelling table to hold the roller guide and a sample table to mount a sample thereon. These tables are fixed by a pin which can be more easily deformed than the tables and are linked with each other by an elastic body.

1 Claim, 8 Drawing Sheets

TRAVELLING WORKTABLE APPARATUS

This application is a divisional application of Ser. No. 09/793,941 now U.S. Pat. No. 6,446,950.

BACKGROUND OF THE INVENTION

1. Field of the Invention

The present invention relates to a travelling worktable apparatus (a sample travelling worktable apparatus or a sample stage apparatus) for semiconductor manufacturing apparatuses, semiconductor inspecting apparatuses, and working tools to achieve fine machining with high precision, and in particular, to improvement of measurement errors in measurement of a position of a sample.

2. Description of the Related Art

In general, in semiconductor manufacturing apparatuses and/or semiconductor inspecting apparatuses, a travelling stage apparatus (travelling worktable apparatus) to transport a sample such as a wafer must have a positioning function with high precision. Therefore, a laser for high-precision measurement is usually employed to detect a sample position. In such a configuration, a position of a mirror placed on a sample table is measured by a laser to control the sample position. In the detection of the sample position according to values measured by a laser, variation in distance between the mirror (bar mirror) and the sample has been heretofore neglected. However, in an apparatus which requires higher precision in the positioning of a sample, the distance between the bar mirror and the sample varies by deformation of the table caused by a guide apparatus, for example, deviation in precision of rollers used in the guide apparatus and precision in attachment of the guide apparatus. It is consequently difficult to control the sample position with high precision.

Referring to FIGS. 1 and 2, description will be given of the problem for easy understanding of the gist of the problem.

First, description will be given of a configuration of a general travelling table apparatus of FIG. 1 and a measuring method of the apparatus.

The configuration of FIG. 1 includes a top table 1 which can travel in an x-axis direction and in a y-axis direction, an X bar mirror 5 for x-directional measurement, and a Y bar mirror 6 for y-directional measurement. A sample 30 is placed on the top table 1. It is necessary to keep the sample 30 at the position when the top table 1 is moved. Therefore, the sample is adsorbed onto the top table 1 using vacuum or electrostatic force or is mechanically fixed thereon. First, the x-directional measurement will be described. Laser emitted from a laser head 10 is split by a beam splitter 9. Resultant light proceeds via an interferometer 7 in a direction vertical to the X bar mirror 5. Reflected light from the mirror 5 again passes through the interferometer 7 (the light again reflects on the mirror 5 in a double-path system). There is obtained interference light. The light is then received by a receiver 8. The receiver 8 accordingly produces a signal indicating a position of the mirror 5. Also in the y-axis direction, the distance between the interferometer 7 and the Y bar mirror 6 can be detected in a similar way. If the distance between the sample and each of the bar mirrors is kept unchanged, the sample position can be controlled with high precision according to variation in the distance of each bar mirror.

However, when the top table 1 is deformed as shown in FIG. 2, distance between a center of the sample 30 on the top table 1 and the mirror for x-directional measurement increases by ΔX relative to original distance X therebetween. An error of ΔX appears in a measured value of distance, and hence the sample positioning precision is lowered.

JP-A-1-274936 describes a prior art example of a travelling stage (X-Y stage). In the configuration of the travelling stage, springs are inserted respectively in a pressurized section and a fixing section of a guide rail so that the guide rail frees deformation of the table caused in association with the precision of the guide apparatus described above or by variation in temperature and a thermal expansion coefficient.

FIG. 11 shows the freeing structure of the guide rail in the prior art example in a schematic diagram.

In the configuration shown in FIG. 11, a coned disc spring 85 is disposed on a support pin 83 of a guide rail 82 on pressurized side, the guide rail being attached onto a travelling table 80. Compressive force of the spring 85 brings the guide rail 82 into tight contact with the travelling table 80. This allows a degree of freedom for the guide rail 82 with respect to variation in pressure beforehand applied on the pressurized side. Also in the pressurized section, a compression spring 87 is arranged for a pressure pin 89 to keep the pressure of the guide apparatus at a predetermined level. This also contributes to suppress deformation of the table 80.

In the configuration of the prior art example, the spring 85 is used to bring the guide rail 82 into tight contact with the travelling table 80. The guide rail 82 on the pressurized side has a degree of freedom also in other than the pressurized direction.

In other words, movement of the table 80 in a direction vertical to an upper surface of the table 80 depends on compressive force of the spring 85. Therefore, when there appears acceleration due to shock or vibration in the vertical direction, the upper surface of the table 80 easily becomes unstable. To overcome this difficulty, if it is desired to increase rigidity of the table 80 in the vertical direction, the spring 85 must have a larger spring modulus. However, to guarantee the original purpose, namely, the smooth shift toward the pressurized direction, frictional force on the attaching surface must be minimized.

For this purpose, it can be considered a method to reduce roughness of the attaching surface, namely, to smooth the surface like a mirror surface. However, in consideration of the overall travelling table, since rigidity of the table in the travelling direction is as low as that in the pressurized direction, the structure becomes weak with respect to self-excited vibration and/or external disturbance.

SUMMARY OF THE INVENTION

It is therefore an object of the present invention to provide a travelling worktable apparatus in which deformation of the guide apparatus is reduced to a low level while keeping rigidity of the guide apparatus such that the distance between the mirror and a sample placed on the upper surface of the table can be kept fixed.

In accordance with the present invention, there is provided a travelling worktable apparatus, comprising a fixed base, an intermediate table mounted on said fixed base with a first guide disposed therebetween, said intermediate table being capable of achieving a reciprocating motion, a top table mounted on said intermediate table with a second guide disposed therebetween, said top table being capable of achieving a reciprocating motion in a direction which intersects a direction of the reciprocating motion of said intermediate table; and a measuring mirror disposed on said top table. The top table comprises a travelling table for holding said second guide, a sample table disposed on said travelling table for mounting a sample thereon, a pin for restricting said travelling table and said sample table, said pin being more easily deformed than said travelling table and said sample table; and an elastic body disposed between said travelling table and said sample table.

BRIEF DESCRIPTION OF THE DRAWINGS

The objects and features of the present invention will become more apparent from the consideration of the following detailed description taken in conjunction with the accompanying drawings in which.

DETAILED DESCRIPTION

Figure 1:
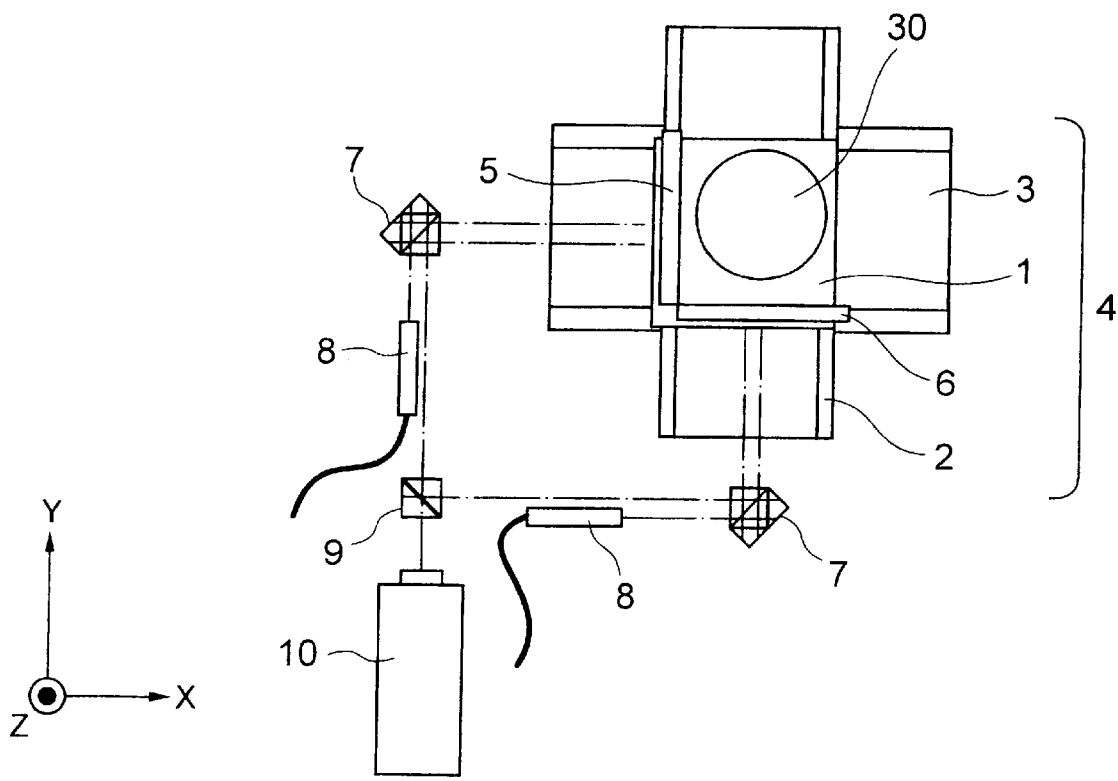
FIG. 1 is a plan view showing an overall configuration of a general travelling worktable apparatus.
Figure 2:
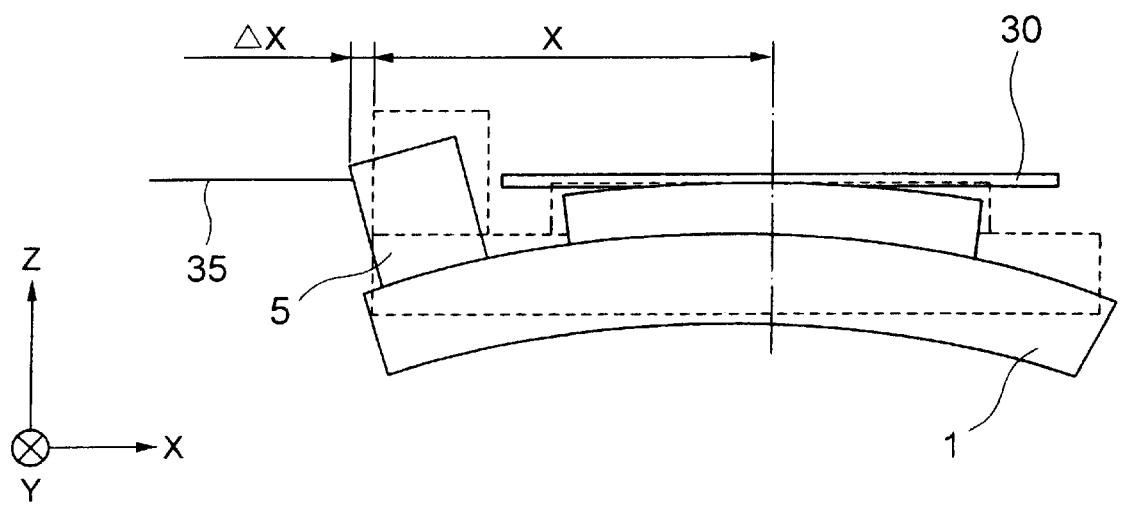
FIG. 2 is a side view showing a variation of a table in the travelling worktable apparatus shown in FIG. 1.

Referring now to the drawings, description will be given of an embodiment according to the present invention.

First, description will be given of embodiments shown in FIGS. 3A, 3B, 4, and 5.

Figure 3A:
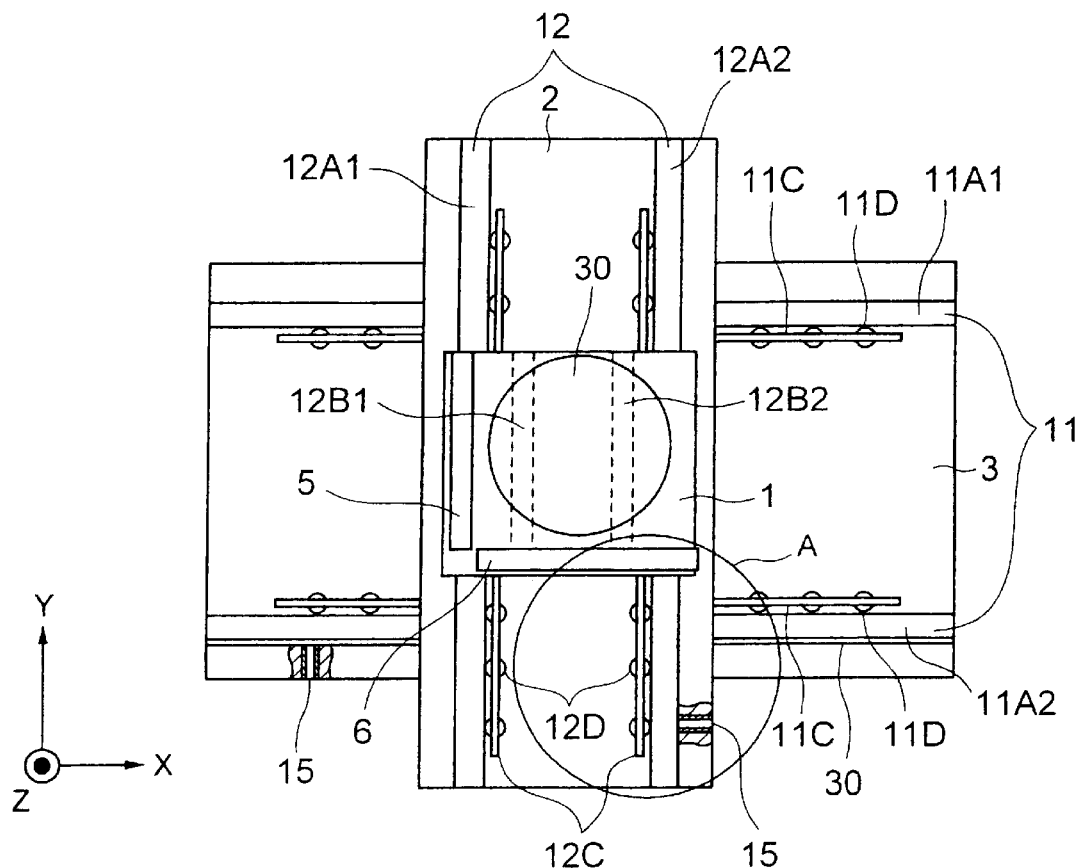
FIG. 3A is a plan view showing an embodiment of a travelling worktable apparatus according to the present invention.
Figure 3B:
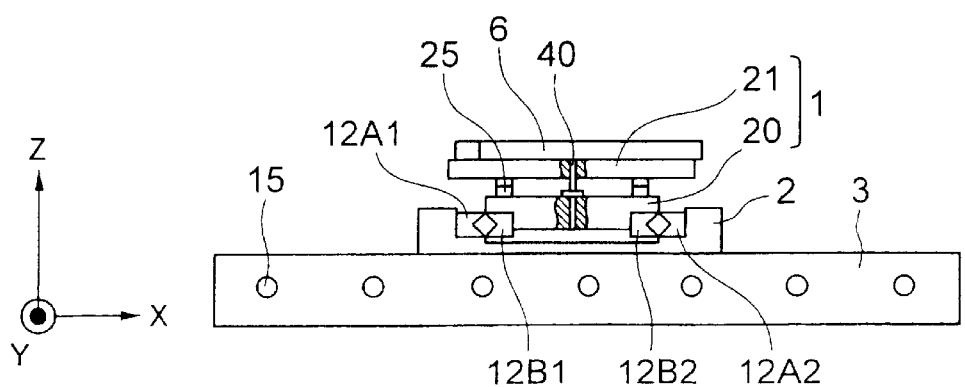
FIG. 3B is a side view showing an embodiment of a travelling worktable apparatus according to the present invention.
Figure 4:
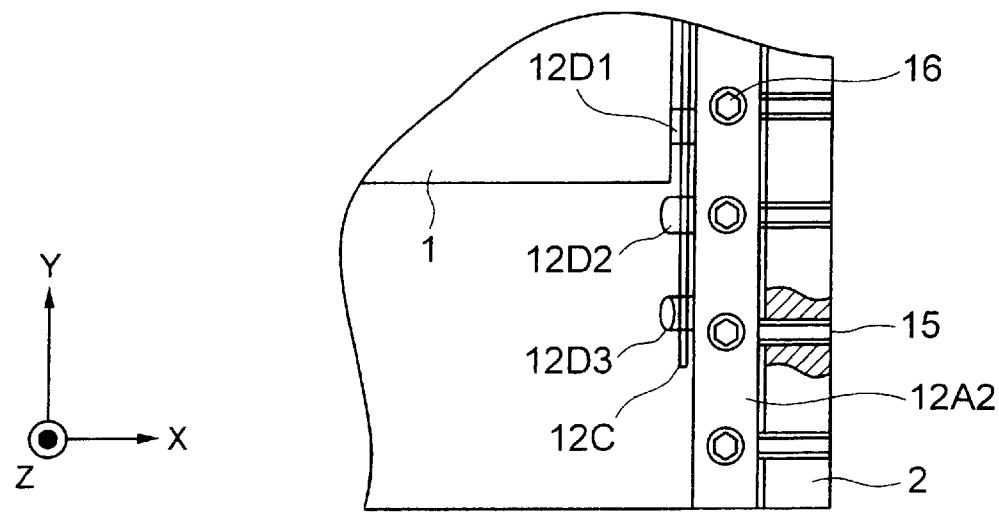
FIG. 4 is a magnified view of section A of FIG. 3A.

FIGS. 3A, 3B, and 4 are a plan view of a travelling worktable apparatus, a side view thereof, and a magnified view of section A of FIG. 3A, respectively.

In FIGS. 3A and 3B, an X table (intermediate table) 2 is mounted on a fixed base 3 with a roller guide unit 11 disposed therebetween. A Y table (top table) 1 is mounted on a intermediate table 2 with a roller guide unit 12 disposed therebetween. The top table 1 is constituted with a Y1 table (travelling table) 20 to support a guide apparatus and a Y2 table (sample table) 21 to mount a sample and a mirror. Tables 20 and 21 are coupled with each other by a parallel plate spring 25 which easily deforms in the X-axis and Y-axis directions. In the mounting of the tables 2 and 1, a pressure screw 15 pressurizes a pressurized-side guide rail 11A2 attached on the fixed-side table and a pressurized-side guide rail 12A2. Details of the roller guide units will be described by referring to FIGS. 3A, 3B, and 4. Since the roller guide units 11 and 12 are of the same mechanism, description will be given of only the pressure side of the roller guide 12.

FIG. 4 is a magnified plan view of section A of FIG. 3A. The roller guide unit 12 includes two guide rails 12B1 and 12B2 disposed on a rear surface of the Y table 1 in the Y-axis direction, two guide rails 12A1 and 12A2 disposed corresponding to the guide rails 12B1 and 12B2 on the X table 2 in the Y-axis direction, a retainer 12C with a roller 12D arranged between the guide rails, and a pressure screw 15 to apply thrust to bring the roller 12D into tight contact with its opposing guide rail.

The roller guide unit 12 is of a crossed roller type in which many rollers 12D are arranged on the retainer 12C in a cross layout, namely, the rollers 12D alternately changes its direction by 90°. The rollers 12D are held by the retainer 12C in a movable state. That is, the rollers 12D are brought into contact with grooves with a V-shaped cross section respectively disposed in opposing surfaces of the guide rails 12A2 and 12B2 and rolls thereon keeping the contact on the grooves.

Advantages of the embodiment will be described by referring to FIGS. 5 and 6.

Figure 5:
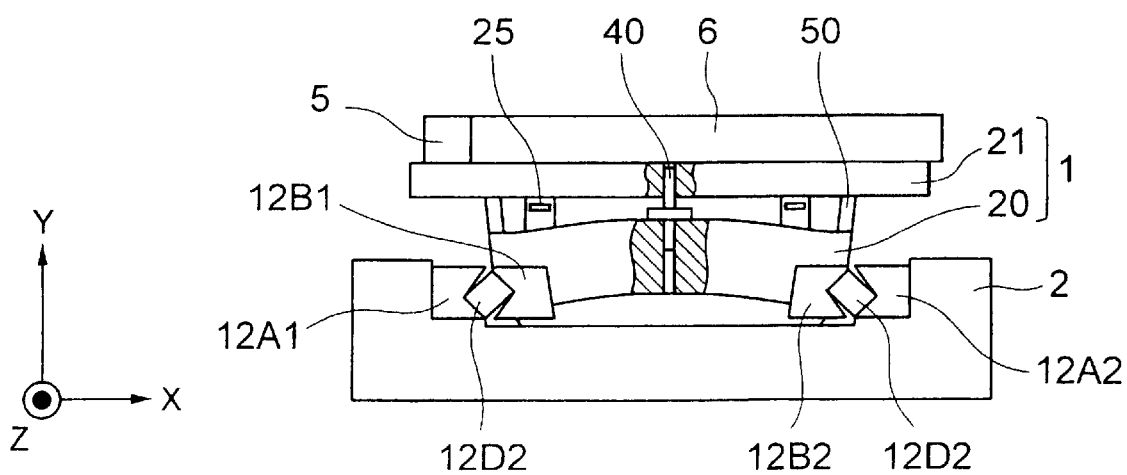
FIG. 5 is a side view to explain the embodiments shown in FIGS. 3A and 3B.
Figure 6:
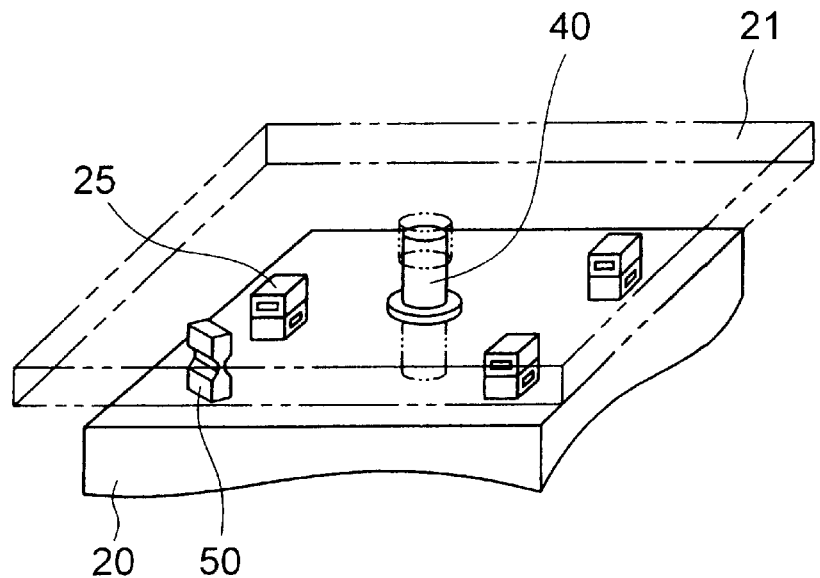
FIG. 6 is a perspective view to explain the embodiments shown in FIGS. 3A and 3B.

When the guide rail 12A2 is pressurized, if a diameter of the roller 12D1 held between the guide rails 12A2 and 12B2 and between guide rails 12A1 and 12B1 (FIG. 4) is smaller than a diameter of the roller 12D2 which is going to enter a space between the guide rails for table transportation, force is upward applied in an inclined direction between the guide rails due to the direction of the roller 12D2 in FIGS. 5 and 6. The Y1 table 20 is resultantly deformed. However, the deformation is absorbed by the spring 25 disposed between the Y1 table 20 and the Y2 table 21, and hence the deformation of the Y2 table 21 is reduced. Next, the roller 12D3 to enter the space between the guide rails (FIG. 4) is changed in direction by 90° relative to the roller 12D2. Therefore, the Y1 table 20 receives force downward in an inclined direction. However, the deformation of the sample table 21 is minimized as described above. In this connection, similar advantage can be expected for deformation of the tables caused by attaching errors of the guide rails and/or deformation of the tables due to variation in temperature.

By disposing an absorber 50 between the sample table 21 and the travelling table 20, vibration of the Y2 table 21 can be controlled. It is therefore possible to mitigate influence of reduction of rigidity due to an elastic body or element. There may be employed a mechanical absorber employing air, fluid, and the like as well as materials having vibration preventing effect such as synthetic resin, lubber, and the like.

Figure 7:
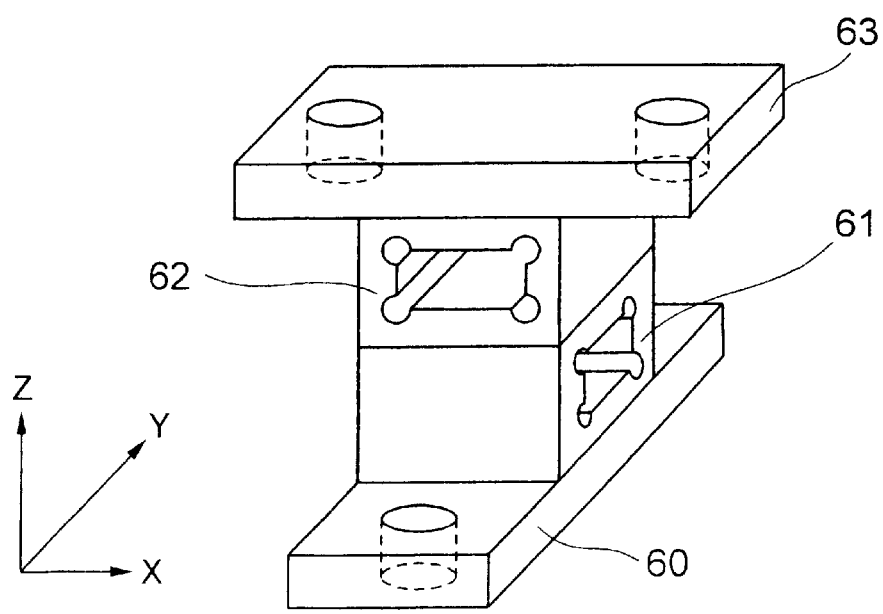
FIG. 7 is a perspective view of a parallel plate spring in another embodiment according to the present invention.
Figure 8:
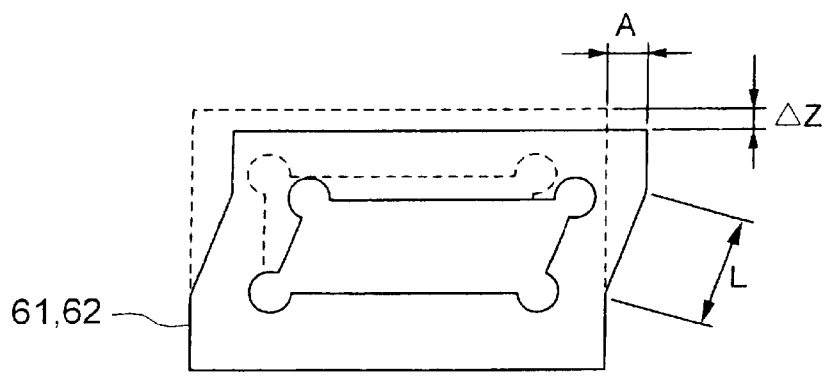
FIG. 8 is a side view to explain action of the plate spring shown in FIG. 7.

When a degree of freedom exists between the Y1 table 20 and the Y2 table 21, the position of the Y2 table 21 relative to the Y1 table 20 is easily changed. In the positioning of a sample, this elongates a period of time to determine a position of the Y2 table 21 by acceleration or deceleration. To overcome the difficulty, a part of the Y1 table 20 and a part of the Y2 table 21 are restricted by a pin 40 having rigidity lower than that of the Y1 table 20 and the Y2 table 21 as shown in FIG. 6 to thereby remove translational motion of the Y2 table 21. Additionally, a parallel plate spring 25 including plate spring members 61 and 62 which can be easily deformed in one direction as shown in FIGS. 7 and 8 is attached with the deforming directions of the respective members 61 and 62 respectively matching the X-axis and Y-axis direction. This configuration prevents rotary motion of the Y2 table 21.

Description will now be given of another embodiment shown in FIGS. 7 and 8.

This embodiment is a parallel plate spring which can absorb deformation of the travelling table.

The parallel plate spring includes a Y1 table attaching member 60, a plate spring member 61 which can easily deform in the Y-direction of FIG. 7, a plate spring member 62 which is disposed on the member 61 and which can easily deform in the X-direction of FIG. 7, and a Y2 table attaching member 63. The spring members 61 and 62 easily deform in the directions which are substantially orthogonal to each other. Therefore, even when deformation containing X-directional and Y-directional components takes place in the travelling table, the deformation can be absorbed by the spring members 61 and 62. FIG. 8 shows a state of the spring member 62 when the parallel plate spring is deformed. As can be seen from FIG. 8, the spring is changed in height by the deformation. Variation of the height can be obtained using an expression as follows.

$$\Delta Z = L(1-\cos\theta); \theta = \sin^{-1}(A/L)$$

where, $\Delta Z$ is displacement in a Z-axis direction of Y2 attaching member, L is length of the plate spring member, and A is relative displacement between Y1 table attaching member and Y2 table attaching member.

Assume that the plate spring member has a height of 10 millimeters (mm) and the relative displacement between the Y1 table attaching member and the Y2 table attaching member is one micrometer ($\mu$m). Then, the displacement $\Delta Z$ in the Z-axis direction can be considerably minimized as $$\Delta Z = 0.05 \text{ nanometer } (nm).$$

Next, description will be given of another embodiment shown in FIG. 9.

In this embodiment, a parallel plate spring is not used as the elastic member or unit.

Figure 9:
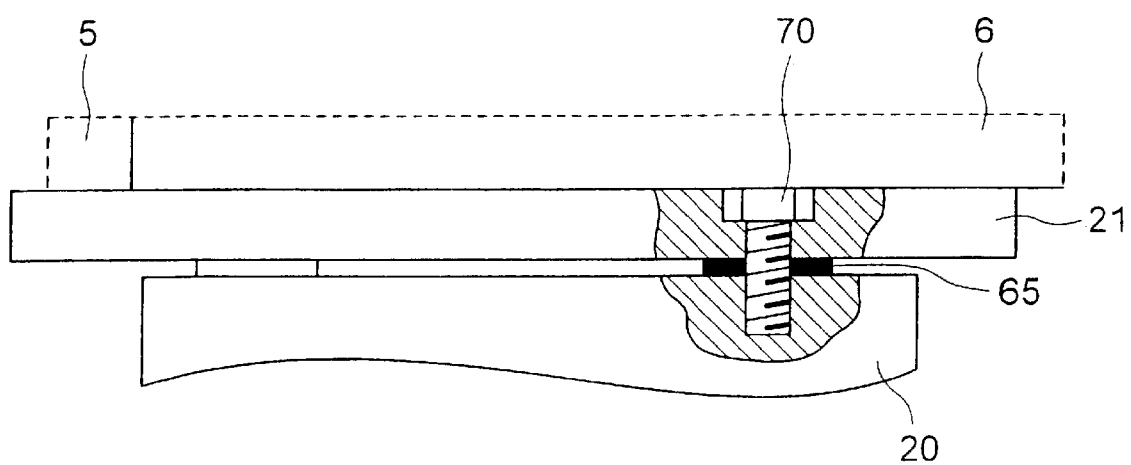
FIG. 9 is a side view of a sample table and a travelling table in another embodiment according to the present invention.

As shown in FIG. 9, in a configuration in which the Y2 table 21 is linked with the Y1 table 20 by a bolt 70 with a spacer 65 between the tables 21 and 20, when an elastic modulus of the Y2 table 21 is large than that of the bolt 70, the bolt 70 serves as the elastic member. That is, deformation of the Y2 table 21 can be absorbed by the bolt 70. As such a combination, when the Y2 table 1 is made of ceramics and the bolt 70 is made of-phosphor bronze, the advantage is enhanced. Advantageous absorption of the deformation can also be achieved by increasing the number of bolts and by reducing the diameter of the bolts.

Subsequently, another embodiment shown in FIGS. 10A and 10B will be described.

Figure 10A:
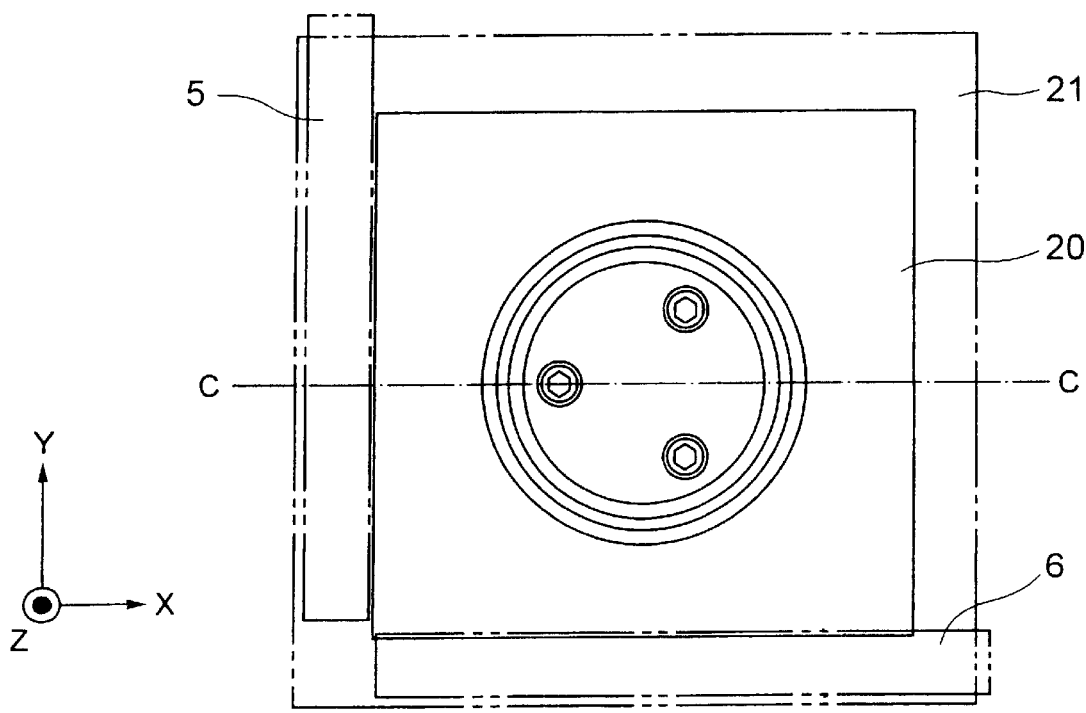
FIG. 10A is a plan view showing a sample table and a travelling table in another embodiment according to the present invention.
Figure 10B:
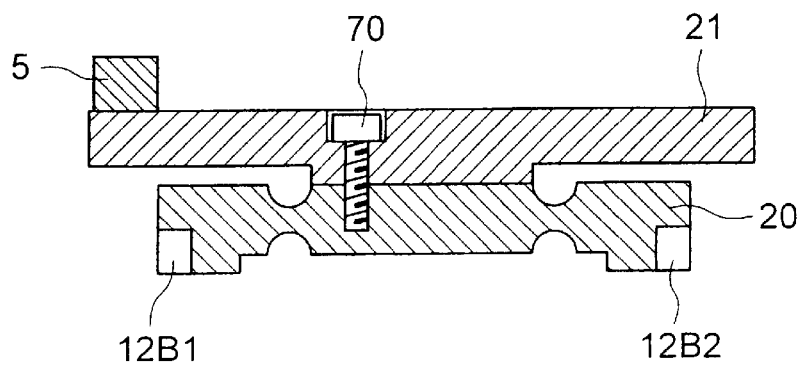
FIG. 10B is a cross-sectional diagram showing a sample table and a travelling table in another embodiment according to the present invention.
Figure 11:
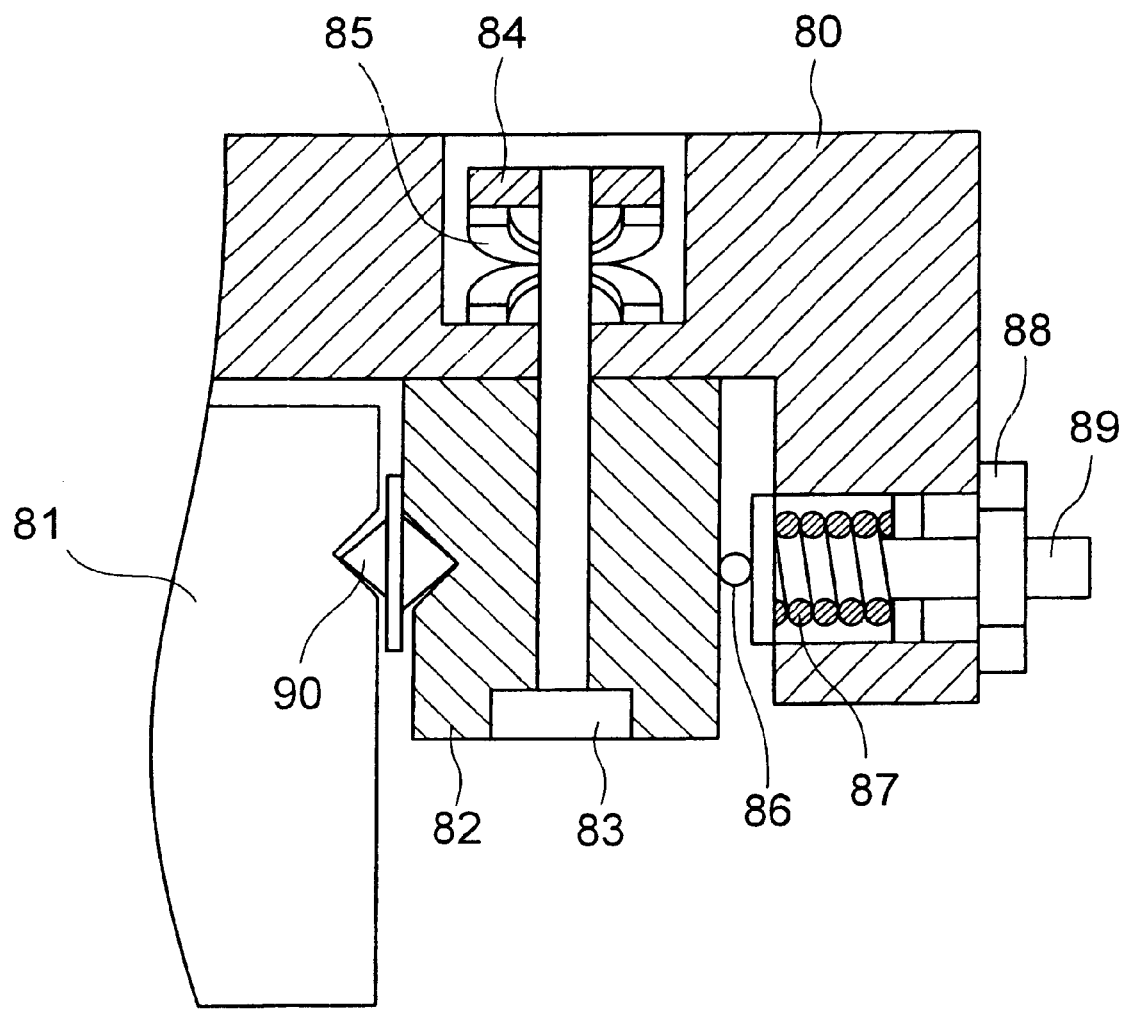
FIG. 11 is a magnified cross-sectional diagram showing part of a sample table and part of a travelling table in a prior art example.

FIG. 10A is a plan view of the sample table and the travelling table and FIG. 10B is a cross-sectional view along line C—C of FIG. 10A.

This example is associated with a travelling worktable apparatus. In the apparatus, a travelling table includes a part which can be easily deformed, and deformation in linking part between the travelling table and the sample table is minimized.

In the configuration, the Y1 table 20 is directly linked with the Y2 table 21 by the bolt 70. In this state, only a central area of the Y1 table 20 is brought contact with a central area of the Y2 table 21. As shown in FIG. 10B, a groove is formed in the Y1 table 20. The Y1 table 20 is therefore easily deformed in an area near the groove. The central part of the Y1 table 20 in contact with the Y2 table 21 is configured such that deformation of the guide retaining section is not easily propagated. When compared with the second embodiment not using the parallel plate spring, this embodiment is more effective to reduce deformation of the sample table. Additionally, the elastic member is formed integrally in the Y2 table, the number of parts can be reduced and the size of the apparatus can be efficiently minimized.

In accordance with the present invention, the deformation of the tables is minimized while keeping rigidity of the guide apparatus. Therefore, the distance between the mirror and the sample on the upper surface of the table can be kept fixed.

While the present invention has been described in detail and pictorially in the accompanying drawings, it is not limited to such details since many changes and modifications recognizable to those of ordinary skill in the art may be made to the invention without departing from the spirit and scope thereof.

What is claimed is:

1. A travelling worktable apparatus, comprising:

a fixed base;

an intermediate table mounted on said fixed base with a first guide disposed therebetween, said intermediate table being capable of achieving a reciprocating motion;

a top table mounted on said intermediate table with a second guide disposed therebetween, said top table being capable of achieving a reciprocating motion in a direction which intersects a direction of the reciprocating motion of said intermediate table; and a measuring mirror disposed on said top table, wherein said top table comprises:

a travelling table for holding said second guide;

a sample table disposed on said travelling table for mounting a sample thereon; and a bolt for restricting said travelling table and said sample table with a spacer disposed between the travelling table and the sample table, said bolt being more easily deformed than said travelling table and said sample table.

* * * * *